US012650176B2

(12) United States Patent
    Takakura

(10) Patent No.:    US 12,650,176 B2
(45) Date of Patent:        Jun. 9, 2026

(54) FLUID CONTROL VALVE, FLUID CONTROL DEVICE AND DRIVE CIRCUIT

(71) Applicant: HORIBA STEC, Co., Ltd., Kyoto (JP)

(72) Inventor: Hiroshi Takakura, Kyoto (JP)

(73) Assignee: HORIBA STEC, Co., Ltd., Kyoto (JP)

( * ) Notice:    Subject to any disclaimer, the term of this patent is extended or adjusted under 35 U.S.C. 154(b) by 113 days.

(21) Appl. No.: 18/923,498

(22) Filed:    Oct. 22, 2024

(65)                Prior Publication Data

US 2025/0129861 A1        Apr. 24, 2025

(30)        Foreign Application Priority Data

Oct. 23, 2023    (JP) ................................. 2023-181858

(51) Int. Cl.
    *F16K 31/00*        (2006.01)
    *G05D 7/06*        (2006.01)
    *H10P 72/00*        (2026.01)
(52) U.S. Cl.
    CPC ......... *F16K 31/007* (2013.01); *G05D 7/0635* (2013.01); *H10P 72/0402* (2026.01)
(58) Field of Classification Search
    CPC .. F16K 31/007; H10P 72/0402; G05D 7/0635
    See application file for complete search history.

(56)                References Cited

U.S. PATENT DOCUMENTS 4,065,096 A  *  12/1977  Frantz ................. F16K 31/0679
                                            361/198
    6,520,479 B1 *   2/2003  Sato ...................... F16K 31/007
                                            251/84
   11,162,602 B2 *  11/2021  Ransdell ............... F16K 31/007
 2019/0093784 A1 *   3/2019  Ito ........................... B07B 11/04

FOREIGN PATENT DOCUMENTS

JP            2020201630 A    12/2020

* cited by examiner

*Primary Examiner* — P. Macade Nichols
(74) *Attorney, Agent, or Firm* — Alleman Hall LLP

(57)                ABSTRACT

A drive circuit of a piezo actuator is provided with a flyback transformer whose primary winding is connected to a DC power supply, and whose secondary winding is connected to the piezo actuator, a charging switch that is connected to the primary winding, a discharging switch that is connected to the secondary winding, a regenerative capacitor that is connected to the primary winding and in which discharge energy from the piezo actuator is regenerated, and a switch control unit that controls ON/OFF operations of the charging switch and the discharging switch. The switch control unit controls the ON/OFF operations of the charging switch and the discharging switch so as to repeatedly charge and discharge the piezo actuator and thereby control the applied voltage of the piezo actuator.

9 Claims, 5 Drawing Sheets

FLUID CONTROL VALVE, FLUID CONTROL DEVICE AND DRIVE CIRCUIT

CROSS-REFERENCE TO RELATED APPLICATION

The present application claims priority to Japanese Patent Application No. 2023-181858 filed Oct. 23, 2023, entitled "FLUID CONTROL VALVE, FLUID CONTROL DEVICE AND DRIVE CIRCUIT" which is incorporated herein by reference in its entirety.

BACKGROUND OF THE INVENTION

Technical Field

The present invention relates to a fluid control valve, a fluid control device, and a drive circuit.

Description of the Related Art

In a semiconductor manufacturing process, for example, a flow rate of gas that is being supplied to a chamber interior is controlled by a mass flow controller. This mass flow controller is provided with a fluid control valve that includes, for example, a piezo actuator, and with a flow rate sensor. A voltage that is applied to the piezo actuator is controlled such that a deviation between a measurement flow rate measured by the flow rate sensor and a set flow rate is reduced.

In a case in which voltage is applied to a piezo actuator that is in an extended state so as to shorten the piezo actuator, it is necessary for the electrical charge stored in the piezo actuator to be discharged. Conventionally, the electrical charge discharged from the piezo actuator is consumed as heat, for example, in resistors and the like provided on a drive circuit.

In recent years there are cases in which, as in an ALD process, the supplying and withholding of gas are repeated at a high speed and at a rapid frequency, and in such cases, it is necessary that the fluid control valve be opened at closed at high speed. As a consequence of this, there is an increase in the number of occasions when energy is discharged from the piezo actuator, so that heat loss in the drive circuit increases and there is a deterioration in the energy efficiency.

For this reason, as is shown in Patent Document 1, a structure in which a bidirectional power supply circuit (i.e., a flyback transformer) that regenerates an electrical charge (i.e., energy) towards the power supply side when the piezo actuator is discharging energy is used may be considered. In this bidirectional power supply circuit, the operating mode is switched between an output to a secondary side (i.e., when the piezo actuator is being charged) and a regeneration to a primary side (i.e., when the piezo actuator is discharging energy). More specifically, during charging, only a charging switch is turned ON and OFF so as to charge the piezo actuator, while during discharging, only a discharging switch is turned ON and OFF so as to discharge energy from the piezo actuator.

However, in a case in which a user desires to perform control at a constant voltage or in a case in which a user desires to perform control within an extremely small voltage range, it is necessary for such control to be performed at the same time as the operating mode is being switched between a charging mode and a discharging mode. Consequently, control of the bidirectional power supply circuit becomes extremely complicated and, in some cases, there is a possibility that the output voltage will end up oscillating.

DOCUMENTS OF THE PRIOR ART

Patent Documents

Patent Document 1: Japanese Patent Application No. 2020-201630

SUMMARY OF THE INVENTION

The present invention was, therefore, conceived in order to solve the above-described drawbacks and it is an object thereof to accurately control an output voltage of a piezo actuator without switching an operating mode between when the piezo actuator is being charged and when it is being discharged.

In other words, a fluid control valve according to the present invention is a fluid control valve having a piezo actuator and a drive circuit that is connected to the piezo actuator, and is characterized in that the drive circuit is provided with a flyback transformer whose primary winding is connected to a DC power supply, and whose secondary winding is connected to the piezo actuator, a charging switch that is connected to the primary winding and is turned ON and OFF in order to charge the piezo actuator, a discharging switch that is connected to the secondary winding and is turned ON and OFF in order to discharge the piezo actuator, a regenerative capacitor that is connected to the primary winding and in which discharge energy from the piezo actuator is regenerated, and a switch control unit that controls ON/OFF operations of the charging switch and the discharging switch. Moreover, the switch control unit is characterized in that the applied voltage of the piezo actuator is controlled by controlling the ON/OFF operations of the charging switch and the discharging switch so as to repeatedly charge and discharge the piezo actuator.

According to this type of fluid control valve, because the applied voltage of the piezo actuator is controlled by repeatedly charging and discharging the piezo actuator, it is possible to accurately control an output voltage of a piezo actuator without switching the operating mode between when the piezo actuator is being charged and when it is being discharged. In particular, in the present invention, in a case in which a piezo actuator is controlled at a constant voltage or within a predetermined extremely small voltage range, because it is not necessary to switch operating modes between when the piezo actuator is being charged and when it is being discharged, it is possible to accurately control the output voltage of the piezo actuator.

As a specific aspect of the present invention, it is desirable that the switch control unit repeatedly charge and discharge the piezo actuator by repeating a cycle in which an ON/OFF operation of the charging switch is performed once and an ON/OFF operation of the discharging switch is performed once.

As a specific aspect of the present invention, it is also desirable that the switch control unit control the ON/OFF operations of the charging switch and the discharging switch so as to control a ratio between charging energy from a single charging of the piezo actuator and discharging energy from a single discharging of the piezo actuator, and thereby control the applied voltage of the piezo actuator.

As a specific aspect of the present invention for controlling the ratio between the charging energy from a single charging of a piezo actuator and the discharging energy from a single discharging of the piezo actuator, the switch control unit switches the charging switch from ON to OFF when a primary-side switch current value flowing to the charging switch reaches a predetermined primary-side peak current value, and switches the discharging switch from ON to OFF when a secondary-side switch current value flowing to the discharging switch reaches a predetermined secondary-side peak current value, and controls the ratio between the charging energy from a single charging of the piezo actuator and the discharging energy from a single discharging of the piezo actuator by controlling a ratio between the primary-side peak current value and the secondary-side peak current value.

As a specific aspect for controlling the ratio between the primary-side peak current value and the secondary-side peak current value, it is desirable that the switch control unit control the ratio between the primary-side peak current value and the secondary-side peak current value based on an output voltage to the piezo actuator.

It is also desirable that the switch control unit include a primary-side peak current setting portion that sets the primary-side peak current value based on a voltage command to the piezo actuator and on the output voltage to the piezo actuator, a secondary-side peak current setting portion that sets the secondary-side peak current value by performing an inverting amplification on the set primary-side peak current value using an inverting amplifier circuit, a charging switch driving portion that drives the charging switch based on the primary-side peak current value and on the value of the current flowing through the charging switch, and a discharging switch driving portion that drives the discharging switch based on the secondary-side peak current value and on the value of the current flowing through the discharging switch.

In the secondary-side peak current setting portion, it is desirable that a cycle in which only the charging of the piezo actuator is repeated, a cycle in which the charging and discharging of the piezo actuator are repeated, and a cycle in which only the discharging of the piezo actuator is repeated be set by lowering a reference potential input into a non-inverting amplification terminal of the inverting amplifier circuit.

A fluid control device according to the present invention is characterized in being provided with the above-described fluid control valve, a fluid sensor that measures a fluid flowing through a flow path, and a valve control unit that controls the fluid control valve based on a measurement value from the fluid sensor.

Furthermore, a drive circuit according to the present invention is a drive circuit that is connected to a piezo actuator, and is characterized in being provided with a flyback transformer whose primary winding is connected to a DC power supply, and whose secondary winding is connected to the piezo actuator, a charging switch that is connected to the primary winding and is turned ON and OFF in order to charge the piezo actuator, a discharging switch that is connected to the secondary winding and is turned ON and OFF in order to discharge the piezo actuator, a regenerative capacitor that is connected to the primary winding and in which discharge energy from the piezo actuator is regenerated, and a switch control unit that controls ON/OFF operations of the charging switch and the discharging switch, wherein the switch control unit repeatedly charges and discharges the piezo actuator by performing an ON/OFF operation of the charging switch alternatingly with an ON/OFF operation of the discharging switch, and also controls the applied voltage of the piezo actuator by controlling the size of the charging energy generated by a single charging of the piezo actuator and the size of the discharging energy generated by a single discharging of the piezo actuator.

As is described above, according to the present invention it is possible to accurately control an output voltage of a piezo actuator without switching an operating mode between when the piezo actuator is being charged and when it is being discharged.

DETAILED DESCRIPTION

Hereinafter, an embodiment of a fluid control device according to the present invention will be described with reference made to the drawings.

Note that, in order to simply an understanding thereof, each of the drawings described below is shown with either omissions or enhancements made where these are appropriate. Moreover, component elements that are the same in the respective drawings are given the same descriptive symbols and any duplicated description thereof is omitted where appropriate.

[Structure of a Fluid Control Device]

A fluid control device 100 of the present embodiment is used, for example, in a semiconductor manufacturing process, and is provided on either one or a plurality of gas supply lines, and controls a flow rate of processing gas flowing through each gas supply line.

Figure 1:
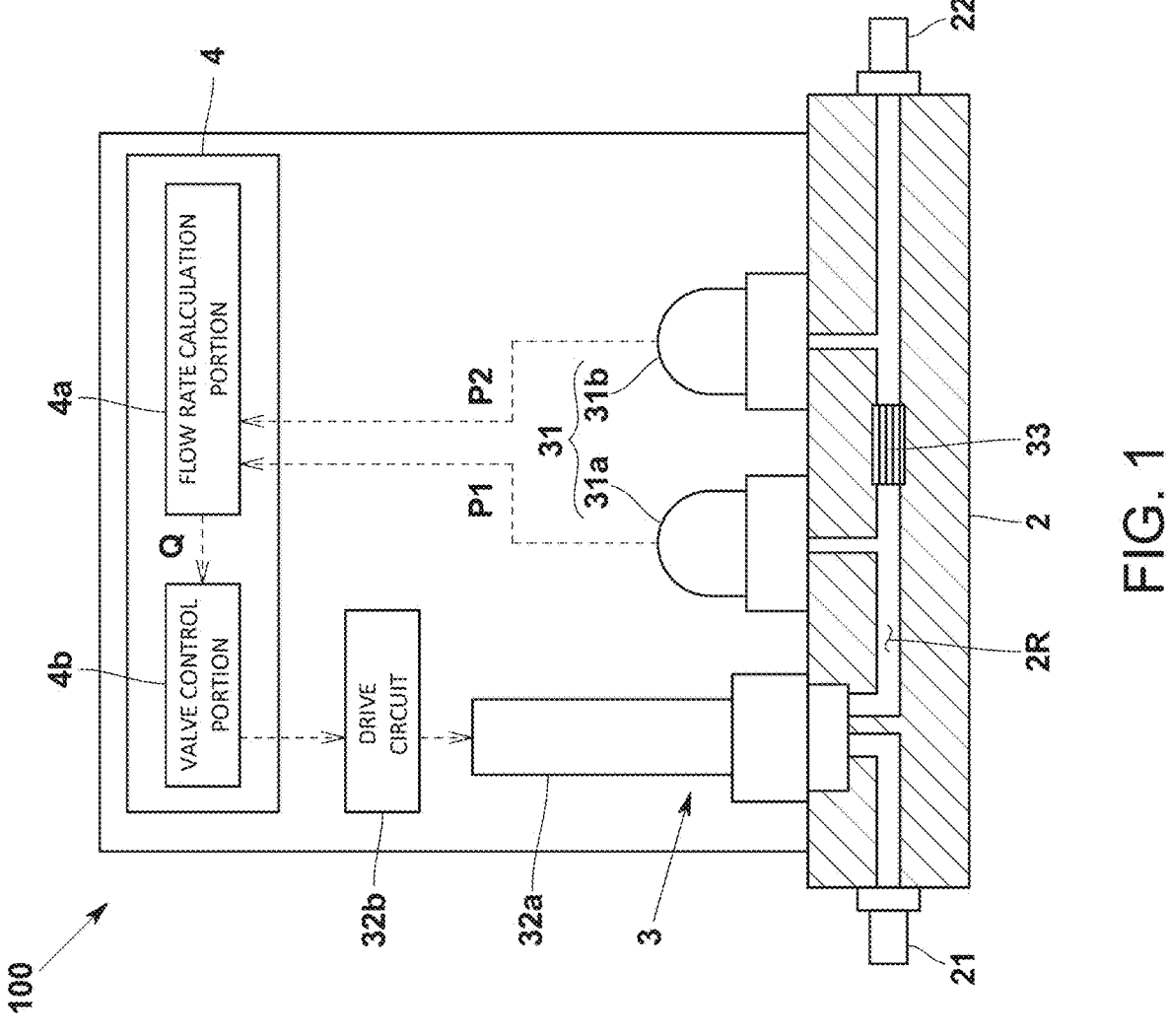
FIG. 1 is a view schematically showing a structure of a fluid control device according to an embodiment of the present invention.

More specifically, the fluid control device 100 is what is known as a differential pressure mass flow controller (differential pressure MFC) and, as is shown in FIG. 1, is provided with a flow path block 2 in which are formed a plurality of internal flow paths 2R, and with a fluid control mechanism 3 that is mounted on the flow path block 2.

An intake port 21 through which a fluid is introduced into the internal flow paths 2R, and an outlet port 22 through which a fluid is flowed out from the internal flow paths 2R are provided in the flow path block 2.

The fluid control mechanism 3 controls a fluid in the internal flow paths 2R, and includes a flow rate sensor 31 that measures a flow rate of the fluid flowing through the internal flow paths 2R, and a fluid control valve 32 that is provided on an upstream side of the flow rate sensor 31. Note that feedback control is performed by a control unit 4 (described below) on a valve opening of the fluid control valve 32.

The flow rate sensor 31 is a differential pressure flow rate sensor and includes an upstream-side pressure sensor 31a that is provided on the upstream side of a fluid resistance element 33 such as a restrictor or an orifice or the like that is provided on the internal flow paths 2R, and a downstream-side pressure sensor 31b that is provided on the downstream side of the fluid resistance element 33. A flow rate Q flowing through the internal flow paths 2R is calculated by a flow rate calculation portion 4a of the control unit 4 (described below) using an upstream-side pressure P1 of the fluid resistance element 33 as measured by the upstream-side pressure sensor 31a, and a downstream-side pressure P2 of the fluid resistance element 33 as measured by the down-stream-side pressure sensor 31b.

The fluid control valve 32 is provided on the upstream side of the differential pressure flow rate sensor 31. The fluid control valve 32 controls the flow rate by using a piezo actuator to cause a valve body to move forwards or backwards relative to a valve seat. More specifically, the fluid control valve 32 is provided with a valve seat, a valve body that is displaced relative to the valve seat, a piezo actuator 32a that causes the valve body to be displaced, and a drive circuit 32b that drives the piezo actuator 32a. The piezo actuator 32a is formed, for example, by alternately stacking piezo elements and electrodes. This piezo actuator 32a is changed to a length that corresponds to a voltage that is applied by the drive circuit 32b. Note that a more detailed description of the drive circuit 32b is given below.

The control unit 4 includes the flow rate calculation portion 4a that calculates the flow rate Q flowing through the internal flow paths 2R based on the upstream-side pressure P1 and the downstream-side pressure P2, and a valve control portion 4b that controls the fluid control valve 32 based on the flow rate Q calculated by the flow rate calculation portion 4a. Note that the control unit 4 is what is commonly known as a computer that is equipped, for example, with a CPU, memory, A/D and D/A converters, and input/output devices. This control unit 4 performs the functions of the flow rate calculation portion 4a and the valve control portion 4b as a result of a flow rate control program stored in the memory being executed so as to cause the various devices to operate in mutual collaboration with each other.

The flow rate calculation portion 4a calculates the flow rate Q flowing through the internal flow paths 2R from the respective measured pressures P1 and P2 measured by the upstream-side pressure sensor 31a and the downstream-side pressure sensor 31b. In other words, the upstream-side pressure sensor 31a, the fluid resistance element 33, the downstream-side pressure sensor 31b, and the flow rate calculation portion 4a form what is known as a pressure-based flow rate sensor 31. Note that an existing formula may be used by the flow rate calculation portion 4a as the formula for calculating the flow rate. The flow rate Q calculated by the flow rate calculation portion 4a is output to the valve control portion 4b as a measurement flow rate.

The valve control portion 4b performs flow rate feedback control on the valve opening of the fluid control valve 32 so that any deviation between the set flow rate set by a user and the measurement flow rate Q calculated by the flow rate calculation portion 4a is reduced. This valve control portion 4b is a PID controller into which the deviation between the set flow rate and the measurement flow rate is input, and that employs a PID computation to output a voltage command that is applied to the fluid control valve 32.

[Drive Circuit 32b of the Fluid Control Valve 32]

Next, the drive circuit 32b of the fluid control valve 32 will be described in detail with reference to FIG. 2.

Figure 2:
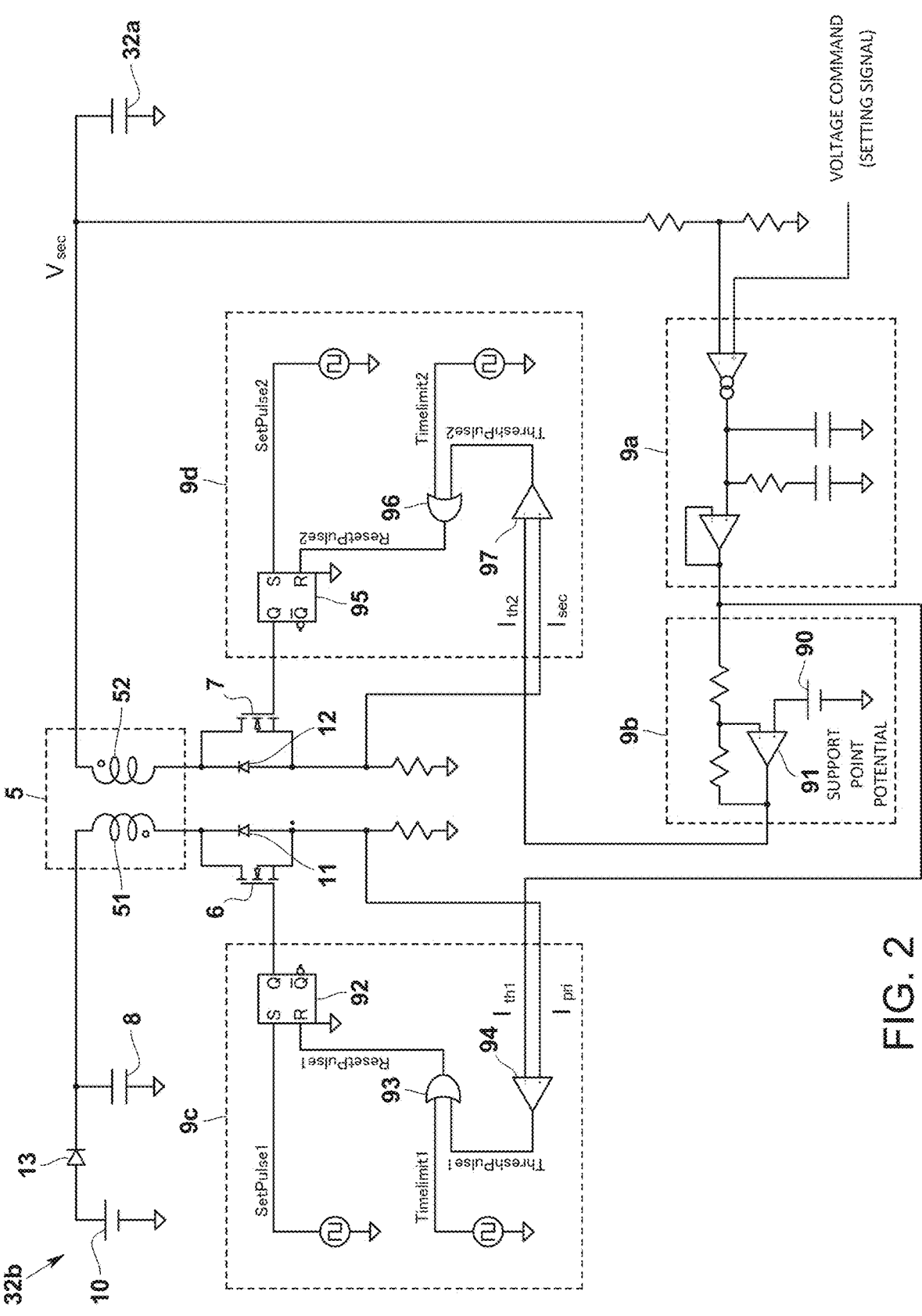
FIG. 2 is a view schematically showing a structure of a drive circuit of the same embodiment.

As is shown in FIG. 2, the drive circuit 32b is provided with a flyback transformer 5, a charging switch 6, a discharging switch 7, a regenerative capacitor 8, and a switch control unit 9 that controls ON/OFF operations of the charging switch 6 and the discharging switch 7.

The flyback transformer 5 includes a primary winding 51 that is connected to a DC power supply 10, and a secondary winding 52 that is connected to the piezo actuator 32a.

The charging switch 6 that is turned ON and OFF in order to charge the piezo actuator 32a is connected to the low-voltage side of the primary winding 51. This charging switch 6 is a semiconductor switch such as, for example, a field effect transistor (FET) or the like, and drive commands output from the switch control unit 9 are input into a gate thereof. A rectifier diode 11 that is used to supply current in one direction from the low-voltage side to a high-voltage side in the primary winding 51 is connected in parallel to the charging switch 6.

The discharging switch 7 that is turned ON and OFF in order to discharge the piezo actuator 32a is connected to the low-voltage side of the secondary winding 52. This dis-charging switch 7 is a semiconductor switch such as, for example, a field effect transistor (FET) or the like, and drive commands output from the switch control unit 9 are input into a gate thereof. A rectifier diode 12 that is used to supply current in one direction from the low-voltage side to a high-voltage side in the secondary winding 52 is connected in parallel to the discharging switch 7.

The regenerative capacitor 8 in which electrical energy generated by a discharge of the piezo actuator 32a (referred to below as discharge energy) is regenerated is connected to the high-voltage side of the primary winding 51. This regenerative capacitor 8 is connected in parallel in the primary winding 51 to the DC power supply 10.

Above this, a diode 13 is connected to the high-voltage side of the primary winding 51 on the DC power supply 10 side of the connection point with the regenerative capacitor 8. An anode of this diode 13 is connected to the DC power supply 10 side, while a cathode thereof is connected to the regenerative capacitor 8 side. When the piezo actuator 32a is being discharged, the current generated from the primary winding 51 of the flyback transformer 5 flows only to the regenerative capacitor 8.

The switch control unit 9 controls ON/OFF operations of the charging switch 6 and the discharging switch 7. More specifically, the switch control unit 9 controls the ON/OFF operations of the charging switch 6 and the discharging switch 7 so as to repeatedly charge and discharge the piezo actuator 32a, and thereby control the applied voltage of the piezo actuator 32a. Here, the switch control unit 9 repeat-edly charges and discharges the piezo actuator 32a by repeating a cycle in which an ON/OFF operation of the charging switch 6 is performed once and an ON/OFF operation of the discharging switch 7 is performed once.

The switch control unit 9 of the present embodiment controls a ratio between the charging energy from a single charging of the piezo actuator 32a and the discharging energy from a single discharging of the piezo actuator 32a by causing the ON/OFF operations of the charging switch 6 and the discharging switch 7 to be performed alternatingly, and thereby controls the applied voltage of the piezo actuator 32*a*. This switch control unit 9 switches the charging switch 6 from ON to OFF when a primary-side switch current value $I_{pri}$ flowing to the charging switch 6 reaches a predetermined primary-side peak current value $I_{th1}$. In addition, the switch control unit 9 switches the discharging switch 7 from ON to OFF when a secondary-side switch current value $I_{sec}$ flowing to the discharging switch 7 reaches a predetermined secondary-side peak current value $I_{th2}$. Moreover, the switch control unit 9 controls the ratio between the charging energy from a single charging of the piezo actuator 32*a* and the discharging energy from a single discharging of the piezo actuator 32*a* by controlling a ratio between the primary-side peak current value $I_{th1}$ and the secondary-side peak current value $I_{th2}$ based on an output voltage $V_{sec}$ output to the piezo actuator 32*a*.

The structure of the switch control unit 9 will now be described in more detail. As is shown in FIG. 2, the switch control unit 9 is provided with a primary-side peak current setting portion 9*a* that sets the primary-side peak current value $I_{th1}$ based on the output voltage $V_{sec}$ to the piezo actuator 32*a*, a secondary-side peak current setting portion 9*b* that sets the secondary-side peak current value $I_{th2}$ by performing an inverting amplification on the set primary-side peak current value $I_{th1}$, a charging switch driving portion 9*c* that drives the charging switch 6 based on the primary-side peak current value $I_{th1}$ and on the value of the current $I_{pri}$ flowing through the charging switch 6, and a discharging switch driving portion 9*d* that drives the discharging switch 7 based on the secondary-side peak current value $I_{th2}$ and on the value of the current flowing through the discharging switch 7.

The primary-side peak current setting portion 9*a* sets the primary-side peak current value $I_{th1}$ based on the voltage command value input from the valve control portion 4*b* and on the output voltage $V_{sec}$ to the piezo actuator 32*a*.

Figure 3:
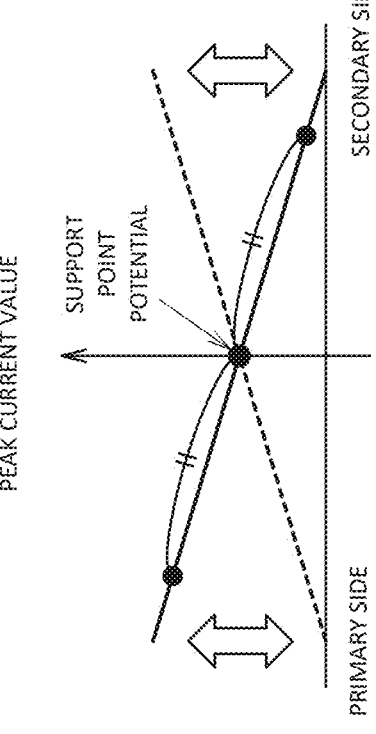
FIG. 3 is a schematic view showing a relationship between a primary peak current value and a secondary peak current value in the same embodiment.

The secondary-side peak current setting portion 9*b* sets the secondary-side peak current value $I_{th2}$ by performing an inverting amplification on the primary-side peak current value $I_{th1}$ set by the primary-side peak current setting portion 9*a* using an inverting amplifier circuit 91. Here, a reference potential (i.e., a support point potential) that serves as a reference for inverting the primary-side peak current value $I_{th1}$ is input from a support point potential setting portion 90 into a non-inverting amplification terminal of the inverting amplifier circuit 91. Moreover, as is shown in FIG. 3, the primary-side peak current value $I_{th1}$ and the secondary-side peak current value $I_{th2}$ are determined using as a reference the support point potential input into the non-inverting amplification terminal of the inverting amplifier circuit 91.

The charging switch driving portion 9*c* is formed using a flip-flop circuit 92. A charging ON pulse (Setpulse1) that is used to set the charging switch 6 to ON is input into the setting terminal of this flip-flop circuit 92, while a primary-side reset pulse (ResetPulse1) that is used to set the charging switch 6 to OFF is input into the resetting terminal thereof. The charging switch 6 is made to perform an ON/OFF operation as a result of a drive command being output to a gate of the charging switch 6 from an output terminal of the flip-flop circuit 92.

Note that the primary-side reset pulse is generated based on a reset pulse (hereinafter, referred to as a primary-side ON limit pulse (TimeLimit1)) that is used to switch the charging switch 6 to OFF prior to a discharging ON pulse (Setpulse2) that is used to switch the discharging switch 7 to ON being generated, and on a primary-side arrival signal (ThreshPulse1) that shows that the current value $I_{pri}$ flowing through the charging switch 6 has reached the primary-side peak current value $I_{th1}$. More specifically, the primary-side reset pulse is a signal that is output as a result of the primary-side ON limit pulse and the primary-side arrival signal being input into an OR circuit 93. Note that the primary-side arrival signal is a High signal that is output from a primary-side comparator 94 into which the current value $I_{pri}$ flowing through the charging switch 6 and the primary-side peak current value $I_{th1}$ are input.

The discharging switch driving portion 9*d* is formed using a flip-flop circuit 95. A discharging ON pulse (Setpulse2) that is used to set the discharging switch 7 to ON is input into the setting terminal of this flip-flop circuit 95, while a secondary-side reset pulse (ResetPulse2) that is used to set the discharging switch 7 to OFF is input into the resetting terminal thereof. The discharging switch 7 is made to perform an ON/OFF operation as a result of a drive command being output to a gate of the discharging switch 7 from an output terminal of the flip-flop circuit 95.

Note that the secondary-side reset pulse is generated based on a reset pulse (hereinafter, referred to as a secondary-side ON limit pulse (TimeLimit2)) that is used to switch the discharging switch 7 to OFF prior to a charging ON pulse (Setpulse1) that is used to switch the charging switch 6 to ON being generated, and on a secondary-side arrival signal (ThreshPulse2) that shows that the current value $I_{sec}$ flowing through the discharging switch 7 has reached the secondary-side peak current value $I_{th2}$. More specifically, the secondary-side reset pulse is a signal that is output as a result of the secondary-side ON limit pulse and the secondary-side arrival signal being input into an OR circuit 96. Note that the secondary-side arrival signal is a High signal that is output from a secondary-side comparator 97 into which the current value $I_{sec}$ flowing through the discharging switch 7 and the secondary-side peak current value $I_{th2}$ are input.

[Operation of One Cycle of the Drive Circuit 32*b*]

Figure 4:
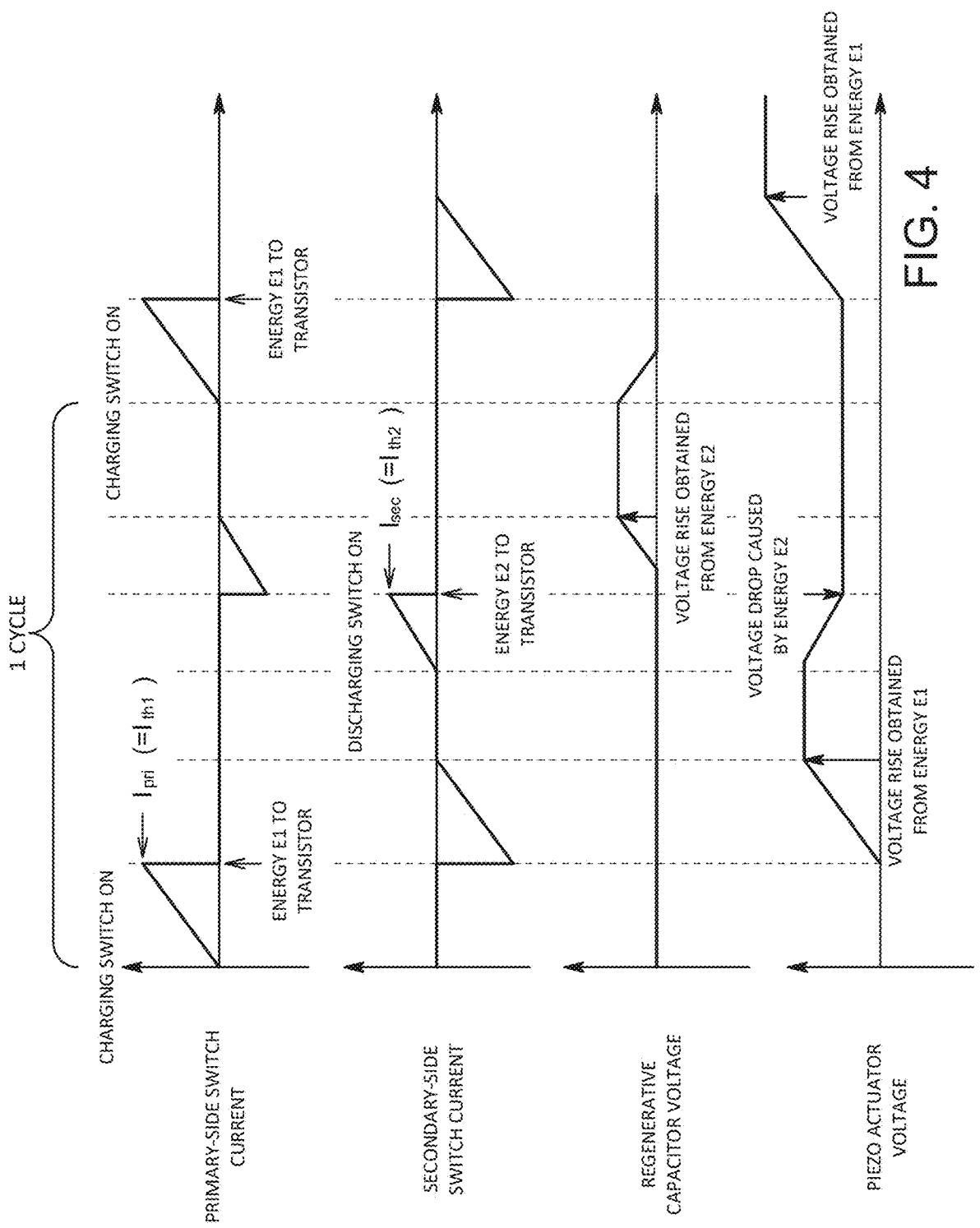
FIG. 4 is a view showing a primary-side switch current, a secondary-side switch current, a regenerative capacitor voltage, and a piezo actuator voltage in an operation of one cycle of the drive circuit of the same embodiment.

Next, an operation of one cycle of the drive circuit 32*b* will be described with reference to FIG. 4. Here an operation of one cycle refers to an operation in which a single charging and a single discharging are performed.

(1) Firstly, when the charging switch 6 is turned ON, a constant current flows to the primary winding 51, and energy ($E1=\frac{1}{2} \times L1 \times I_{pri}^2$) becomes stored in the flyback transformer 5.

(2) When the charging switch 6 is turned OFF, the rectifier diode 12 on the secondary side becomes conductive so that current flows to the secondary winding 52, and the energy (E1) stored in the flyback transformer 5 charges the piezo actuator 32*a* so that the voltage of the piezo actuator 32*a* is increased.

(3) Next, when the discharging switch 7 is turned ON, current flows from the piezo actuator 32*a* to the secondary winding 52, and energy ($E2=\frac{1}{2} \times L2 \times I_{sec}^2$) becomes stored in the flyback transformer 5. At this time, the piezo actuator 32*a* is discharging.

(4) When the discharging switch 7 is turned OFF, the rectifier diode 11 on the primary side becomes conductive so that current flows to the primary winding 51, and the energy (E2) stored in the flyback transformer 5 charges the regenerative capacitor 8 so that the voltage of the regenerative capacitor 8 is increased.

In the next cycle, using the energy regenerated in the regenerative capacitor 8 in the above-described (4), energy is stored in the flyback transformer 5.

[Overall Operation of the Drive Circuit 32*b*]

Figure 5:
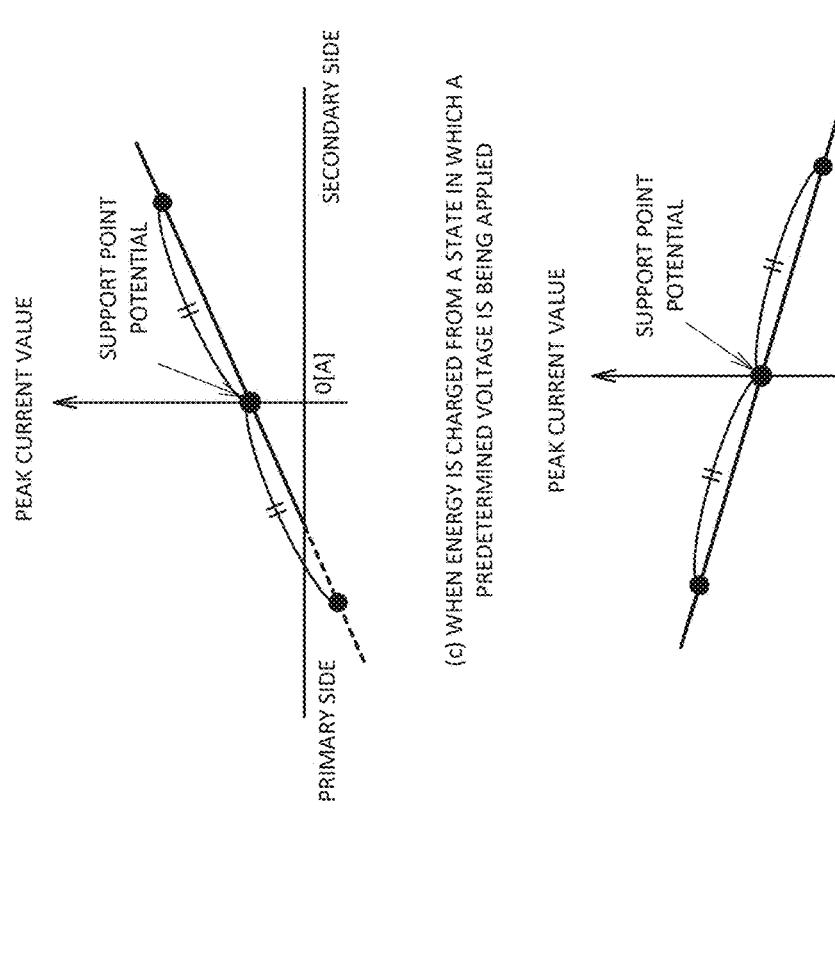
FIG. 5 contains (a) a diagram showing a relationship between a primary peak current value and a secondary peak current value in a case in which control is performed at a constant voltage or within an extremely small voltage range in the same embodiment, (b) a relationship between a primary peak current value and a secondary peak current value in a case in which discharging is performed from a state in which a predetermined voltage is being applied in the same embodiment, and (c) a relationship between a primary peak current value and a secondary peak current value in a case in which charging is performed from a state in which a predetermined voltage is being applied in the same embodiment.

In a case in which the piezo actuator 32*a* is charged by a predetermined voltage, and the fluid control valve 32 is maintained at a predetermined valve opening (i.e., in a case in which control is performed at a constant voltage or within an extremely small predetermined voltage range), as is shown in FIG. 5 (*a*), the switch control unit 9 repeatedly switches the charging switch 6 between ON and OFF and repeatedly switches the discharging switch 7 between ON and OFF with the primary-side peak current value $I_{th1}$ and the secondary-side peak current value $I_{th2}$ being taken as being in a ratio of 1 to 1. Note that the term 'extremely small predetermined voltage range' refers to a range of, for example, ±10% of the full scale of the applied voltage to the actuator. As a result, the charging energy to the piezo actuator 32*a* and the discharging energy from the piezo actuator 32*a* are at a ratio of 1 to 1, the applied voltage of the piezo actuator 32*a* becomes constant, and the fluid control valve 32 is maintained at a predetermined valve opening.

In a case in which the valve opening is changed by discharging energy from a state in which the predetermined voltage is being applied to the piezo actuator 32*a*, as is shown in FIG. 5 (*b*), the switch control unit 9 increases the proportion of the secondary-side peak current value $I_{th2}$ in the ratio between the primary-side peak current value $I_{th1}$ and the secondary-side peak current value $I_{th2}$, so as to repeatedly switch the charging switch 6 between ON and OFF and repeatedly switch the discharging switch 7 between ON and OFF. As a result, the discharging energy from the piezo actuator 32*a* becomes greater than the charging energy to the piezo actuator 32*a* so that the applied voltage of the piezo actuator 32*a* decreases, and the valve opening of the fluid control valve 32 changes.

Here, in a case in which the piezo actuator 32*a* is discharged, there are cases in which the primary-side peak current value $I_{th1}$ set by the primary-side peak current setting portion 9*a* becomes a negative value due to the discharged voltage. In such cases, because a High signal is output from the primary-side comparator 94, the OFF operation of the charging switch 6 is continued while the discharging switch 7 is switched repeatedly between an ON operation and an OFF operation so that only a discharging operation is performed.

Moreover, in a case in which the valve opening is changed by charging energy from a state in which the predetermined voltage is being applied to the piezo actuator 32*a*, as is shown in FIG. 5 (*c*), the switch control unit 9 increases the proportion of the primary-side peak current value $I_{th1}$ in the ratio between the primary-side peak current value $I_{th1}$ and the secondary-side peak current value $I_{th2}$, so as to repeatedly switch the charging switch 6 between ON and OFF and repeatedly switch the discharging switch 7 between ON and OFF. As a result, the charging energy to the piezo actuator 32*a* becomes greater than the discharging energy from the piezo actuator 32*a* so that the applied voltage of the piezo actuator 32*a* increases, and the valve opening of the fluid control valve 32 changes.

Here, in a case in which the piezo actuator 32*a* is charged, there are cases in which the secondary-side peak current value $I_{th2}$ set by the secondary-side peak current setting portion 9*b* becomes a negative value due to the charged voltage. In such cases, because a High signal is output from the secondary-side comparator 97, the OFF operation of the discharging switch 7 is continued while the charging switch 6 is switched repeatedly between an ON operation and an OFF operation so that only a charging operation is performed.

[Effects Obtained from the Present Embodiment]

In this way, according to the fluid control device 100 of the present embodiment, because charging and discharging of the piezo actuator 32*a* are performed repeatedly, and the voltage applied to the piezo actuator 32*a* is controlled by controlling the size of the charging energy generated by a single charging of the piezo actuator 32*a* and the size of the discharging energy generated by a single discharging of the piezo actuator 32*a*, it is possible to accurately control the output voltage from the piezo actuator 32*a* without having to switch the operating mode between when the piezo actuator 32*a* is being charged and when the piezo actuator 32*a* is being discharged.

Additional Embodiments

For example, in the above-described embodiments, an example in which the drive circuit 32*b* is formed from an analog circuit is illustrated, however, it is also possible for the drive circuit 32*b* to be formed from a digital circuit that performs the respective functions of each portion of an analog circuit.

Moreover, in the secondary-side peak current setting portion 9*b*, it is also possible to employ a structure in which, by lowering the reference potential input into the non-inverting amplification terminal of the inverting amplifier circuit 91, it is possible to arbitrarily switch between a cycle in which only the charging of the piezo actuator 32*a* is repeated, a cycle in which both the charging and the discharging of the piezo actuator 32*a* are repeated, and a cycle in which only the discharging of the piezo actuator 32*a* is repeated.

Moreover, the flow rate control device of the above-described embodiment is a differential pressure mass flow controller, however, it is also possible for a thermal mass flow controller to be employed instead.

Furthermore, the fluid control valve of the above-described embodiment is used in a mass flow controller serving as a fluid control device, however, it is also possible for other types of valves such as a pressure control valve of a pressure control device, or a shut-off valve or the like to be used.

In addition, it should be understood that the present invention is not limited to the above-described embodiments, and that various modifications and the like may be made thereto insofar as they do not depart from the spirit or scope of the present invention.

DESCRIPTION OF THE REFERENCE
CHARACTERS

100 . . . Fluid Control Device
10 . . . DC Power Supply
31 . . . Fluid Sensor
32 . . . Fluid Control Valve
32*a* . . . Piezo Actuator
32*b* . . . Drive Circuit
4*b* . . . Valve Control Portion
5 . . . Flyback Transformer
51 . . . Primary Winding
52 . . . Secondary Winding
6 . . . Charging Switch
7 . . . Discharging Switch
8 . . . Regenerative Capacitor

11

9 . . . Switch Control Unit
9a . . . Primary-Side Peak Current Setting Portion
9b . . . Secondary-Side Peak Current Setting Portion
91 . . . Inverting Amplifier Circuit
9c . . . Charging Switch Drive Portion
9d . . . Discharging Switch Drive Portion
What is claimed is:

1. A fluid control valve comprising a piezo actuator and a drive circuit that is connected to the piezo actuator, wherein the drive circuit comprises:

a flyback transformer whose primary winding is connected to a DC power supply, and whose secondary winding is connected to the piezo actuator;

a charging switch that is connected to the primary winding and is turned ON and OFF in order to charge the piezo actuator;

a discharging switch that is connected to the secondary winding and is turned ON and OFF in order to discharge the piezo actuator;

a regenerative capacitor that is connected to the primary winding and in which discharge energy from the piezo actuator is regenerated; and a switch control unit that controls ON/OFF operations of the charging switch and the discharging switch, and wherein the switch control unit controls the ON/OFF operations of the charging switch and the discharging switch so as to repeatedly charge and discharge the piezo actuator, and thereby control the applied voltage of the piezo actuator.

2. The fluid control valve according to claim 1, wherein the switch control unit repeatedly charges and discharges the piezo actuator by repeating a cycle in which an ON/OFF operation of the charging switch is performed once and an ON/OFF operation of the discharging switch is performed once.

3. The fluid control valve according to claim 1, wherein the switch control unit controls the ON/OFF operations of the charging switch and the discharging switch so as to control a ratio between charging energy from a single charging of the piezo actuator and discharging energy from a single discharging of the piezo actuator, and thereby control the applied voltage of the piezo actuator.

4. The fluid control valve according to claim 3, wherein the switch control unit switches the charging switch from ON to OFF when a primary-side switch current value flowing to the charging switch reaches a predetermined primary-side peak current value, and switches the discharging switch from ON to OFF when a secondary-side switch current value flowing to the discharging switch reaches a predetermined secondary-side peak current value, and controls the ratio between the charging energy from a single charging of the piezo actuator and the discharging energy from a single discharging of the piezo actuator by controlling a ratio between the primary-side peak current value and the secondary-side peak current value.

5. The fluid control valve according to claim 4, wherein the switch control unit controls the ratio between the primary-side peak current value and the secondary-side peak current value based on a voltage command to the piezo actuator and on an output voltage to the piezo actuator.

6. The fluid control valve according to claim 4, wherein the switch control unit comprises:

a primary-side peak current setting portion that sets the primary-side peak current value based on the output voltage to the piezo actuator;

a secondary-side peak current setting portion that sets the secondary-side peak current value by performing an inverting amplification on the set primary-side peak current value using an inverting amplifier circuit;

a charging switch driving portion that drives the charging switch based on the primary-side peak current value and on the value of the current flowing through the charging switch; and a discharging switch driving portion that drives the discharging switch based on the secondary-side peak current value and on the value of the current flowing through the discharging switch.

7. The fluid control valve according to claim 6, wherein, in the secondary-side peak current setting portion, a cycle in which only the charging of the piezo actuator is repeated, a cycle in which the charging and discharging of the piezo actuator are repeated, and a cycle in which only the discharging of the piezo actuator is repeated are set by lowering a reference potential input into a non-inverting amplification terminal of the inverting amplifier circuit.

8. A fluid control device comprising:

the fluid control valve according to claim 1;

a fluid sensor that measures a fluid flowing through a flow path; and a valve control unit that controls the fluid control valve based on a measurement value from the fluid sensor.

9. A drive circuit that is connected to a piezo actuator, comprising:

a flyback transformer whose primary winding is connected to a DC power supply, and whose secondary winding is connected to the piezo actuator;

a charging switch that is connected to the primary winding and is turned ON and OFF in order to charge the piezo actuator;

a discharging switch that is connected to the secondary winding and is turned ON and OFF in order to discharge the piezo actuator;

a regenerative capacitor that is connected to the primary winding and in which discharge energy from the piezo actuator is regenerated; and a switch control unit that controls ON/OFF operations of the charging switch and the discharging switch, and wherein the switch control unit controls the charging switch and the discharging switch so as to repeatedly charge and discharge the piezo actuator, and thereby control the applied voltage of the piezo actuator.

* * * * *